(12) United States Patent
Nishida

(10) Patent No.: US 9,257,816 B2
(45) Date of Patent: Feb. 9, 2016

(54) VERTICAL CAVITY SURFACE EMITTING LASER AND ATOMIC OSCILLATOR

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/574,932

(22) Filed: Dec. 18, 2014

(65) Prior Publication Data

US 2015/0180214 A1 Jun. 25, 2015

(30) Foreign Application Priority Data

Dec. 20, 2013 (JP) ................................. 2013-263466

(51) Int. Cl.
*H01S 5/183* (2006.01)
*H01S 5/42* (2006.01)

(52) U.S. Cl.
CPC ....................................... *H01S 5/423* (2013.01)

(58) Field of Classification Search
CPC .............. H01S 5/1835; H01S 5/18344; H01S 5/18308–5/18313
See application file for complete search history.

(56) References Cited

U.S. PATENT DOCUMENTS

| | | | |
|---|---|---|---|
| 5,412,680 A * | 5/1995 | Swirhun et al. | 372/45.01 |
| 6,134,251 A * | 10/2000 | Kawase et al. | 372/27 |
| 6,603,783 B1 * | 8/2003 | Kawase et al. | 372/43.01 |
| 6,631,152 B2 * | 10/2003 | Kaneko et al. | 372/46.01 |
| 6,751,242 B2 | 6/2004 | Kaneko et al. | |
| 2002/0110173 A1* | 8/2002 | di Sopra et al. | 372/46 |
| 2003/0012249 A1* | 1/2003 | Eisenbeiser | 372/96 |
| 2005/0265414 A1* | 12/2005 | Mochizuki | H01S 5/18344 372/43.01 |
| 2006/0002440 A1* | 1/2006 | Nagawa et al. | 372/44.01 |
| 2009/0262770 A1* | 10/2009 | Itoh et al. | 372/44.011 |
| 2011/0182314 A1* | 7/2011 | Yoshikawa et al. | 372/46.012 |
| 2011/0188524 A1* | 8/2011 | Youngner et al. | 372/34 |
| 2011/0228035 A1* | 9/2011 | Ishii et al. | 347/232 |
| 2011/0304684 A1* | 12/2011 | Numata et al. | 347/225 |

FOREIGN PATENT DOCUMENTS

JP 2001-189525 A 7/2001

OTHER PUBLICATIONS

Sopra et al., "Polarization Control in Strained T-Bar VCSELs," Aug. 2002, IEEE Phtonoics Tech. Lett., vol. 14, No. 8, 1034-1036.*

* cited by examiner

*Primary Examiner* — Joshua King
(74) *Attorney, Agent, or Firm* — Harness, Dickey & Pierce, P.L.C.

(57) ABSTRACT

A vertical cavity surface emitting laser includes: a substrate; a first mirror layer; an active layer; a second mirror layer; a first electrode which is electrically connected to the first mirror layer; a second electrode which is electrically connected to the second mirror layer; and a pad which is electrically connected to the second electrode, in which the first mirror layer, the active layer, and the second mirror layer configure a laminated body, the laminated body includes a resonance portion, an insulation layer is provided on a side surface of the laminated body, in a plan view, the insulation layer has a shape line-symmetrical with respect to a virtual straight line passing through a center of the resonance portion, the pad is provided over the insulation layer, and in the plan view, the pad is only provided on one side of the virtual straight line.

8 Claims, 6 Drawing Sheets

VERTICAL CAVITY SURFACE EMITTING LASER AND ATOMIC OSCILLATOR

BACKGROUND

1. Technical Field

The present invention relates to a vertical cavity surface emitting laser and an atomic oscillator.

2. Related Art

The vertical cavity surface emitting laser (VCSEL) is, for example, used as a light source of the atomic oscillator using coherent population trapping (CPT) which is one of the quantum interference effects.

In the vertical cavity surface emitting laser, a resonator generally has an isotropic structure, and accordingly it is difficult to control a polarization direction of laser light emitted from the resonator. JP-A-2001-189525, for example, discloses a vertical cavity surface emitting laser which applies an anisotropic stress to a resonator (active layer) by an insulation layer which is formed to come in contact with an outer surface of a columnar semiconductor deposition body including a part of the resonator, and controls a polarization direction of laser light to a specific direction.

In the vertical cavity surface emitting laser disclosed in JP-A-2001-189525, an upper electrode is formed so as to cover most of the upper surface of the insulation layer.

Therefore, in the vertical cavity surface emitting laser, it is important to decrease parasitic capacitance, in order to improve high frequency characteristics.

However, in the vertical cavity surface emitting laser disclosed in JP-A-2001-189525, since the upper electrode is formed so as to cover most of the upper surface of the insulation layer, it is difficult to sufficiently decrease the parasitic capacitance.

SUMMARY

An advantage of some aspects of the invention is to provide a vertical cavity surface emitting laser which can decrease parasitic capacitance. In addition, another advantage of some aspects of the invention is to provide an atomic oscillator including the vertical cavity surface emitting laser.

An aspect of the invention is directed to a vertical cavity surface emitting laser including: a substrate; a first mirror layer which is provided over the substrate; an active layer which is provided over the first mirror layer; a second mirror layer which is provided over the active layer; a first electrode which is electrically connected to the first mirror layer; a second electrode which is electrically connected to the second mirror layer; and a pad which is electrically connected to the second electrode, in which the first mirror layer, the active layer, and the second mirror layer configure a laminated body, the laminated body includes a resonance portion which resonates light generated by the active layer, an insulation layer is provided on a side surface of the laminated body, in a plan view, the insulation layer has a shape line-symmetrical with respect to a virtual straight line passing through a center of the resonance portion, the pad is provided over the insulation layer, and in the plan view, the pad is only provided on one side of the virtual straight line.

According to the vertical cavity surface emitting laser, it is possible to decrease parasitic capacitance, compared to a case where the pad is provided on both sides of the virtual straight line, for example. Therefore, in the vertical cavity surface emitting laser, it is possible to improve high frequency characteristics, for example.

In the description according to the invention, for example, when a phrase "over" is used in a sentence such as "to form a specific element (hereinafter, referred to as "B") over another specific element (hereinafter, referred to as "A")", the phrase "over" is used to include a case of forming B directly on A and a case of forming B on A with another element interposed therebetween.

In the description according to the invention, for example, a phrase "electrical connection" is used with "a specific member (hereinafter, referred to as a "B member") which is "electrically connected" to another specific member (hereinafter, referred to as an "A member")". In the description according to the invention, in such an example, the phrase "electrical connection" is used to include a case where the A member and the B member directly come in contact with each other and are electrically connected, and a case where the A member and the B member are electrically connected with another member interposed therebetween.

In the vertical cavity surface emitting laser according to the aspect of the invention, the vertical cavity surface emitting laser may further include a lead-out wiring which electrically connects the second electrode and the pad to each other.

According to the vertical cavity surface emitting laser with this configuration, it is possible to decrease the parasitic capacitance.

In the vertical cavity surface emitting laser according to the aspect of the invention, in the plan view, the lead-out wiring may be only provided on the one side of the virtual straight line.

According to the vertical cavity surface emitting laser with this configuration, it is possible to decrease the parasitic capacitance, compared to a case where the lead-out wiring is provided on both sides of the virtual straight line, for example.

In the vertical cavity surface emitting laser according to the aspect of the invention, the laminated body may include a first distortion imparting portion and a second distortion imparting portion, the resonance portion may be provided between the first distortion imparting portion and the second distortion imparting portion, and in the plan view, the virtual straight line may be orthogonal to a direction in which the first distortion imparting portion and the second distortion imparting portion face each other.

According to the vertical cavity surface emitting laser with this configuration, the stress can be applied to the resonance portion (active layer) by both of the first and second distortion imparting portions and the insulation layer, and it is possible to stabilize a polarization direction of laser light.

Another aspect of the invention is directed to an atomic oscillator including the vertical cavity surface emitting laser according to the aspect of the invention.

According to the atomic oscillator, it is possible to include the vertical cavity surface emitting laser which can decrease the parasitic capacitance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to unduly limit the contents of the invention disclosed in the aspects. All of the configurations described below are not limited to the essential constituent elements of the invention.

1. Vertical Cavity Surface Emitting Laser

Figure 1:
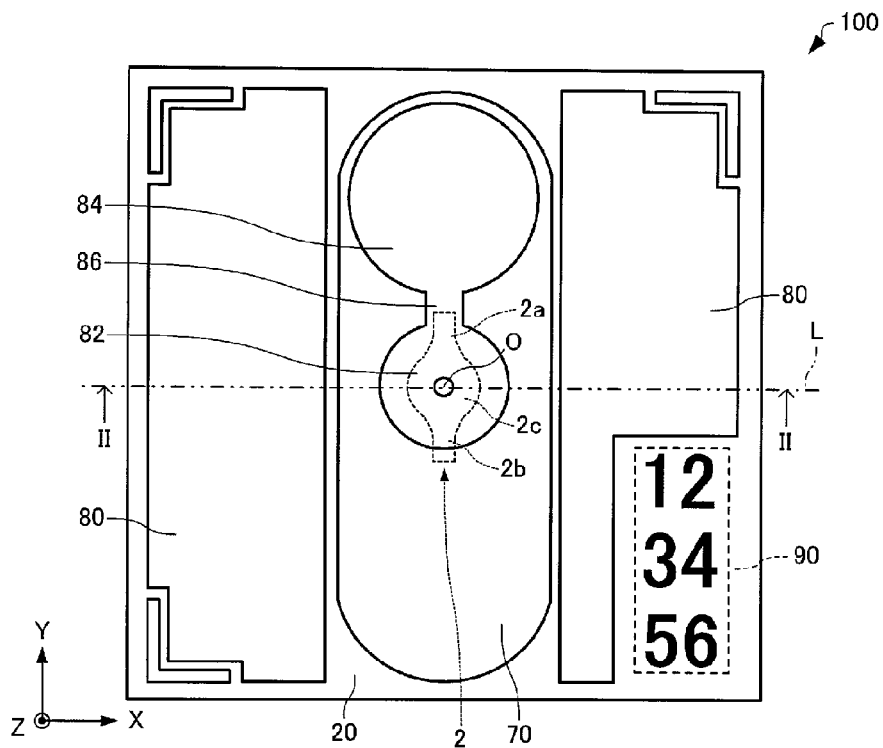
FIG. 1 is a plan view schematically showing a vertical cavity surface emitting laser according to the embodiment.
Figure 2:
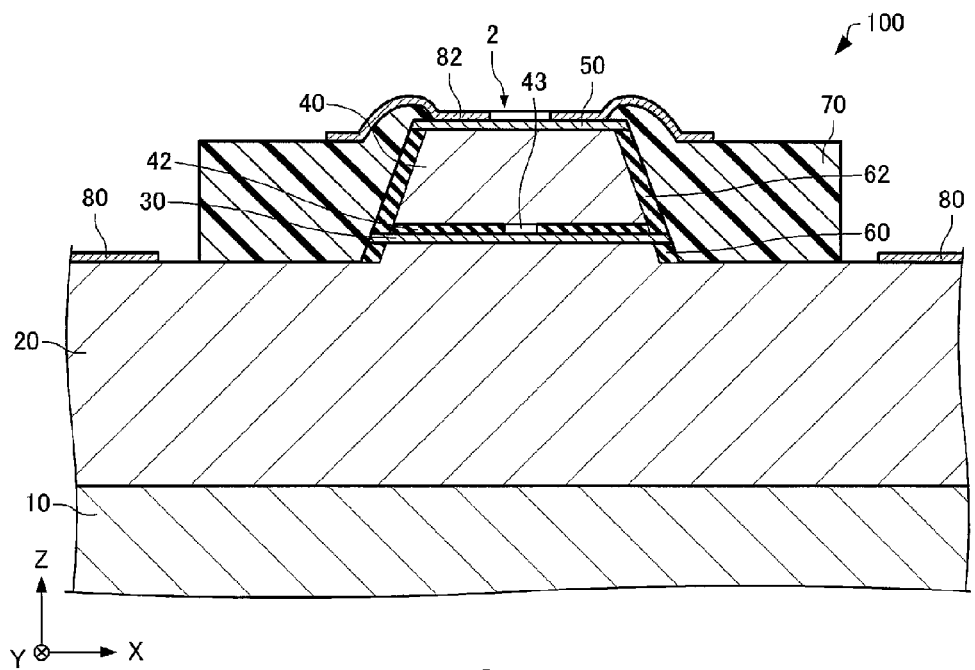
FIG. 2 is a cross-sectional view schematically showing a vertical cavity surface emitting laser according to the embodiment.
Figure 3:
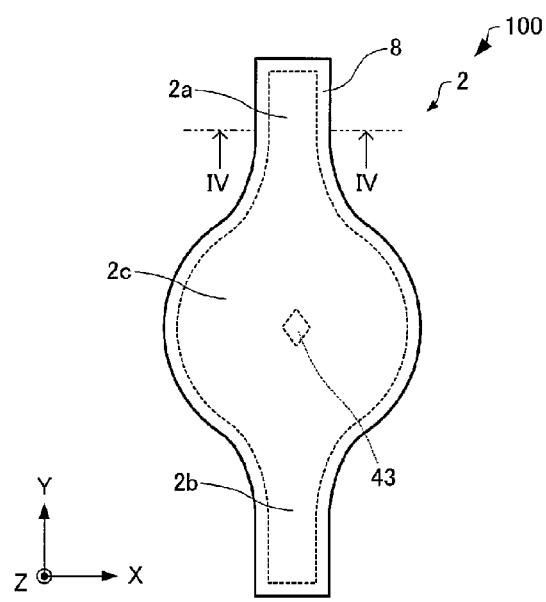
FIG. 3 is a plan view schematically showing a vertical cavity surface emitting laser according to the embodiment.
Figure 4:
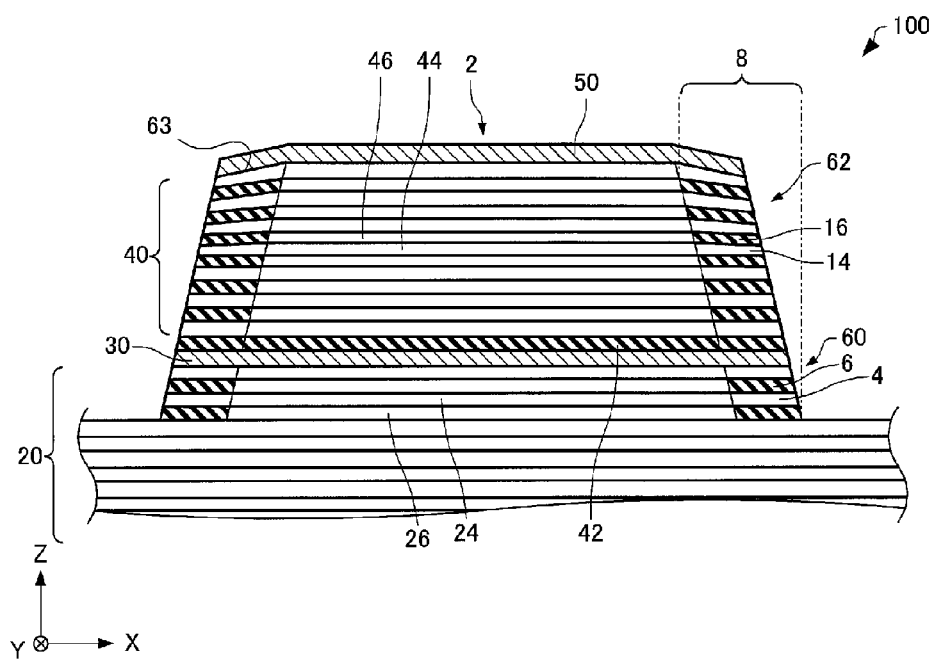
FIG. 4 is a cross-sectional view schematically showing a vertical cavity surface emitting laser according to the embodiment.

First, a vertical cavity surface emitting laser according to the embodiment will be described with reference to the drawings. FIG. 1 is a plan view schematically showing a vertical cavity surface emitting laser 100 according to the embodiment. FIG. 2 is a cross-sectional view which is taken along line II-II of FIG. 1 and schematically shows the vertical cavity surface emitting laser 100 according to the embodiment. FIG. 3 is a plan view schematically showing the vertical cavity surface emitting laser 100 according to the embodiment. FIG. 4 is a cross-sectional view which is taken along line IV-IV of FIG. 3 and schematically shows the vertical cavity surface emitting laser 100 according to the embodiment.

For the sake of convenience, FIG. 2 shows a simplified laminated body 2. In FIG. 3, members other than the laminated body 2 of the vertical cavity surface emitting laser 100 are omitted. FIGS. 1 to 4 show an X axis, a Y axis, and a Z axis as three axes orthogonal to each other.

As shown in FIGS. 1 to 4, the vertical cavity surface emitting laser 100 includes a substrate 10, a first mirror layer 20, an active layer 30, a second mirror layer 40, a current constriction layer 42, a contact layer 50, first areas 60, second areas 62, a resin layer (insulation layer) 70, first electrodes 80, and second electrodes 82.

The substrate 10 is, for example, a first conductive (for example, n-type) GaAs substrate.

The first mirror layer 20 is formed on the substrate 10. The first mirror layer 20 is a first conductive semiconductor layer. As shown in FIG. 4, the first mirror layer 20 is a distribution Bragg reflection (DBR) type mirror in which high refractive index layers 24 and low refractive index layers 26 are laminated onto each other. The high refractive index layer 24 is, for example, an n-type $Al_{0.12}Ga_{0.88}As$ layer on which silicon is doped. The low refractive index layer 26 is, for example, an n-type $Al_{0.9}Ga_{0.1}As$ layer on which silicon is doped. The number (number of pairs) of laminated high refractive index layers 24 and low refractive index layers 26 is, for example, 10 pairs to 50 pairs, specifically, 40.5 pairs.

The active layer 30 is provided on the first mirror layer 20. The active layer 30, for example, has a multiple quantum well (MQW) structure in which three layers having a quantum well structure configured with an i-type $In_{0.06}Ga_{0.94}As$ layer and an i-type $Al_{0.3}Ga_{0.7}As$ layer are overlapped.

The second mirror layer 40 is formed on the active layer 30. The second mirror layer 40 is a second conductive (for example, p-type) semiconductor layer. The second mirror layer 40 is a distribution Bragg reflection (DBR) type mirror in which high refractive index layers 44 and low refractive index layers 46 are laminated onto each other. The high refractive index layer 44 is, for example, a p-type $Al_{0.12}Ga_{0.88}As$ layer on which carbon is doped. The low refractive index layer 46 is, for example, a p-type $Al_{0.9}Ga_{0.1}As$ layer on which carbon is doped. The number (number of pairs) of laminated high refractive index layers 44 and low refractive index layers 46 is, for example, 3 pairs to 40 pairs, specifically, 20 pairs.

The second mirror layer 40, the active layer 30, and the first mirror layer 20 configure a vertical resonator-type pin diode. When a forward voltage of the pin diode is applied between the electrodes 80 and 82, recombination between electrons and positive holes occurs in the active layer 30, and the light emitting occurs. The light generated in the active layer 30 reciprocates between the first mirror layer 20 and the second mirror layer 40 (multiple reflection), the induced emission occurs at that time, and the intensity is amplified. When an optical gain exceeds an optical loss, laser oscillation occurs, and the laser light is emitted in a vertical direction (a lamination direction of the first mirror layer 20 and the active layer 30) from the upper surface of the contact layer 50.

The current constriction layer 42 is provided between the first mirror layer 20 and the second mirror layer 40. In the example shown in the drawing, the current constriction layer 42 is provided on the active layer 30. The current constriction layer 42 can also be provided in the first mirror layer 20 or the second mirror layer 40. In this case as well, the current constriction layer 42 is assumed to be provided between the first mirror layer 20 and the second mirror layer 40. The current constriction layer 42 is an insulation layer in which an opening 43 is formed. The current constriction layer 42 can prevent spreading of the current injected to a vertical resonator by the electrodes 80 and 82 in a planar direction (direction orthogonal to the lamination direction of the first mirror layer 20 and the active layer 30).

The contact layer 50 is provided on the second mirror layer 40. The contact layer 50 is a second conductive semiconductor layer. Specifically, the contact layer 50 is a p-type GaAs layer on which carbon is doped.

As shown in FIG. 4, the first areas 60 are provided on lateral portions of the first mirror layer 20 configuring the laminated body 2. The first areas 60 include a plurality of oxide layers 6 which are provided to be connected to the first mirror layer 20 (in the example shown in the drawing, a part of the first mirror layer 20). Specifically, first areas 60 are configured with the oxide layers 6 obtained by oxidizing layers connected to the low refractive index layers 26 (for example, $Al_{0.9}Ga_{0.1}As$ layers) configuring the first mirror layer 20, and layers 4 connected to the high refractive index layers 24 (for example, $Al_{0.12}Ga_{0.88}As$ layers) configuring the first mirror layer 20 which are laminated on each other.

The second areas 62 are provided on lateral portions of the second mirror layer 40 configuring the laminated body 2. The second areas 62 include a plurality of oxide layers 16 which are provided to be connected to the second mirror layer 40. Specifically, the second areas 62 are configured with the oxide layers 16 obtained by oxidizing layers connected to the low refractive index layers 46 (for example, $Al_{0.9}Ga_{0.1}As$ layers) configuring the second mirror layer 40, and layers 14 connected to the high refractive index layers 44 (for example, $Al_{0.12}Ga_{0.88}As$ layers) configuring the second mirror layer 40 which are laminated on each other. In a plan view (when seen from the lamination direction of the first mirror layer 20 and the active layer 30), oxide areas 8 are configured by the first areas 60 and the second areas 62.

The first mirror layer 20, the active layer 30, the second mirror layer 40, the current constriction layer 42, the contact layer 50, the first areas 60, and the second areas 62 configure the laminated body 2. In the example shown in FIGS. 1 and 2, the laminated body 2 is surrounded with the resin layer 70.

In the example shown in FIG. 3, in a plan view, a length of the laminated body 2 in a Y axis direction is greater than a length of the laminated body 2 in an X axis direction. That is, a longitudinal direction of the laminated body 2 is the Y axis direction. In a plan view, the laminated body 2 is, for example, symmetrical about a virtual straight line which passes through the center of the laminated body 2 and is parallel to the X axis. In a plan view, the laminated body 2 is, for example, symmetrical about a virtual straight line which passes through the center of the laminated body 2 and is parallel to the Y axis.

In a plan view as shown in FIG. 3, the laminated body 2 includes a first distortion imparting portion (first portion) 2a, a second distortion imparting portion (second portion) 2b, and a resonance portion (third portion) 2c.

In a plan view, the first distortion imparting portion 2a and the second distortion imparting portion 2b face each other in the Y axis direction with the resonance portion 2c interposed therebetween. In a plan view, the first distortion imparting portion 2a is protruded from the resonance portion 2c in the positive Y axis direction. In a plan view, the second distortion imparting portion 2b is protruded from the resonance portion 2c in the negative Y axis direction. The first distortion imparting portion 2a and the second distortion imparting portion 2b are provided to be integrated with the resonance portion 2c.

The first distortion imparting portion 2a and the second distortion imparting portion 2b impart distortion to the active layer 30 and polarize light generated in the active layer 30. Herein, to polarize the light is to set a vibration direction of an electric field of the light to be constant. The semiconductor layers (the first mirror layer 20, the active layer 30, the second mirror layer 40, the current constriction layer 42, the contact layer 50, the first areas 60, and the second areas 62) configuring the first distortion imparting portion 2a and the second distortion imparting portion 2b are a generation source which generates distortion to be imparted to the active layer 30. Since the first distortion imparting portion 2a and the second distortion imparting portion 2b include the first areas 60 including the plurality of oxide layers 6 and the second areas 62 including the plurality of oxide layers 16, it is possible to impart a large amount of distortion to the active layer 30.

The resonance portion 2c is provided between the first distortion imparting portion 2a and the second distortion imparting portion 2b. A length of the resonance portion 2c in the X axis direction is greater than a length of the first distortion imparting portion 2a in the X axis direction or a length of the second distortion imparting portion 2b in the X axis direction. A planar shape of the resonance portion 2c (shape when seen from the lamination direction of the first mirror layer 20 and the active layer 30) is, for example, a circle.

Herein, the length of the resonance portion 2c in the X axis direction is, for example, the greatest length along the length of the resonance portion 2c in the X axis direction. The length of the first distortion imparting portion 2a in the X axis direction is, for example, the greatest length along the length of the first distortion imparting portion 2a in the X axis direction. The length of the second distortion imparting portion 2b in the X axis direction is, for example, the greatest length along the length of the second distortion imparting portion 2b in the X axis direction.

The resonance portion 2c resonates light generated in the active layer 30. That is, the vertical oscillator is formed in the resonance portion 2c.

The resin layer 70 is provided at least on side surfaces of the laminated body 2. In the example shown in FIG. 1, the resin layer 70 covers the first distortion imparting portion 2a and the second distortion imparting portion 2b. That is, the resin layer 70 is provided on the side surface of the first distortion imparting portion 2a, the upper surface of the first distortion imparting portion 2a, the side surface of the second distortion imparting portion 2b, and the upper surface of the second distortion imparting portion 2b. The resin layer 70 may completely cover the first distortion imparting portion 2a and the second distortion imparting portion 2b, or may cover some of the first distortion imparting portion 2a and the second distortion imparting portion 2b. The material of the resin layer 70 is, for example, polyimide. In the embodiment, the resin layer 70 for applying the distortion to the distortion imparting portions 2a and 2b is used, but since a configuration corresponding to the resin layer 70 is only necessary to have a function of insulating, the resin may not be used, as long as it is an insulation material.

In the example shown in FIG. 3, in a plan view, a length of the resin layer 70 in the Y axis direction is greater than a length of the resin layer 70 in the X axis direction. That is, a longitudinal direction of the resin layer 70 is the Y axis direction. The longitudinal direction of the resin layer 70 and the longitudinal direction of the laminated body 2 coincide with each other.

The first electrodes 80 are provided on the first mirror layer 20. The first electrodes 80 form ohmic contact with the first mirror layer 20. The first electrodes 80 are electrically connected to the first mirror layer 20. As the first electrodes 80, an electrode in which a Cr layer, an AuGe layer, an Ni layer, and an Au layer are laminated in this order from the first mirror layer 20 side is used, for example. The first electrodes 80 are the electrodes for injecting the current to the active layer 30. Although not shown, the first electrodes 80 may be provided on the lower surface of the substrate 10.

The second electrodes 82 are provided on the contact layer 50 (on the laminated body 2). The second electrodes 82 form ohmic contact with the contact layer 50. In the example shown in the drawing, the second electrodes 82 are also formed on the resin layer 70. The second electrodes 82 are electrically connected to the second mirror layer 40 through the contact layer 50. As the second electrodes 82, an electrode in which a Cr layer, a Pt layer, a Ti layer, a Pt layer, and an Au layer are laminated in this order from the contact layer 50 side is used, for example. The second electrodes 82 are the other electrodes for injecting the current to the active layer 30.

The second electrodes 82 are electrically connected to a pad 84. In the example shown in the drawing, the second electrodes 82 are electrically connected to the pad 84 through a lead-out wiring 86. The pad 84 is provided on the resin layer 70. The material of the pad 84 and the lead-out wiring 86 is, for example, the same as the material of the second electrodes 82. The pad 84 is, for example, a terminal which electrically connects an external power (not shown) and the second electrode 82 to each other. A planar shape of the pad 84 is a circle, for example.

Herein, the resin layer 70, the pad 84, and the lead-out wiring 86 will be described in detail.

In a plan view as shown in FIG. 1, the resin layer 70 has a shape line-symmetrical with respect to a virtual straight line L passing through a center O of the resonance portion 2c. That is, in a plan view, the resin layer 70 is divided into two equivalent areas by the virtual straight line L. In the example shown in the drawing, in a plan view, the resin layer 70 is line-symmetrical with respect to the virtual straight line L and is point-symmetrical with respect to the center O of the resonance portion 2c. In a plan view, the center of the resin layer 70 coincides with the center O of the resonance portion 2c.

In a plan view, the virtual straight line L is, for example, perpendicular to the longitudinal direction of the resin layer 70. In the example shown in the drawing, the virtual straight line L is a straight line parallel to the X axis. In a plan view, the virtual straight line L is orthogonal to a direction (Y axis direction) in which the first distortion imparting portion 2a and the second distortion imparting portion 2b face each other.

In a plan view, the pad 84 is only provided on one side (positive Y axis direction side), when seen from the virtual straight line L. That is, in a plan view, the pad 84 is not provided on the other side (negative Y axis direction side), when seen from the virtual straight line L. In a plan view, the pad 84 is only provided on the positive Y axis direction side of the virtual straight line L.

In a plan view, the lead-out wiring 86 is only provided on one side (positive Y axis direction side), when seen from the virtual straight line L. That is, in a plan view, the lead-out wiring 86 is not provided on the other side (negative Y axis direction side), when seen from the virtual straight line L. In a plan view, the lead-out wiring 86 is only provided on the positive Y axis direction side of the virtual straight line L. As described above, in a plan view, the pad 84 and the lead-out wiring 86 are provided on the same side (positive Y axis direction side), when seen from the virtual straight line L.

In the example shown in the drawing, the pad 84 is provided on the resin layer 70 which is provided on the first mirror layer 20. The lead-out wiring 86 is provided on the resin layer 70 which is provided on the first mirror layer 20, and the resin layer 70 which is provided on the first distortion imparting portion 2a. In the example shown in the drawing, in a plan view, the pad 84 and the lead-out wiring 86 are positioned on a virtual straight line (not shown) which passes through the center O of the resonance portion 2c and is orthogonal to the virtual straight line L.

As shown in FIG. 1, the vertical cavity surface emitting laser 100 includes a chip number writing area 90 in which a chip number for identifying a chip (vertical cavity surface emitting laser 100) is written. The chip number writing area 90 is an area on the upper surface of the first mirror layer 20. In a plan view, the chip number writing area 90 is provided on the other side (negative Y axis direction side), when seen from the virtual straight line L. That is, in a plan view, in the vertical cavity surface emitting laser 100, the pad 84 and the lead-out wiring 86 are provided on one side of the virtual straight line L (positive Y axis direction side), and the chip number writing area 90 is provided on the other side of the virtual straight line L (negative Y axis direction side).

In the above description, the AlGaAs vertical cavity surface emitting laser has been described, but GaInP, ZnSSe, InGaN, AlGaN, InGaAs, GaInNAs, or GaAsSb semiconductor materials may be used according to the oscillation wavelength, for the vertical cavity surface emitting laser according to the invention.

The vertical cavity surface emitting laser 100, for example, has the following characteristics.

In the vertical cavity surface emitting laser 100, in a plan view, the resin layer 70 has a shape line-symmetrical with respect to the virtual straight line L passing through the center O of the resonance portion 2c, the pad 84 is provided over the resin layer 70, and in a plan view, the pad 84 is only provided on one side (positive Y axis direction side), when seen from the virtual straight line L. Accordingly, it is possible to decrease parasitic capacitance, compared to a case where the pad 84 is provided on both sides when seen from the virtual straight line L, for example. Therefore, in the vertical cavity surface emitting laser 100, it is possible to improve high frequency characteristics. For example, in a plan view, when the pad 84 is provided on both sides when seen from the virtual straight line L, one of the pads may be a stub (open stub) which is not connected to anything, and the high frequency characteristics may be degraded. In the vertical cavity surface emitting laser 100, in a plan view, since the pad 84 is provided only on one side when seen from the virtual straight line L, it is possible to avoid the stub and such a problem does not occur.

In the vertical cavity surface emitting laser 100, in a plan view, the resin layer 70 has a shape line-symmetrical with respect to the virtual straight line L passing through the center O of the resonance portion 2c. Accordingly, the resin layer 70 can apply stress symmetrical to the virtual straight line L, to the resonance portion 2c (active layer 30), compared to a case where the resin layer 70 does not have a shape line-symmetrical with respect to the virtual straight line L, for example.

Herein, the resin layer 70 is a resin which is hardened by applying heat, and contracts in a heating step (curing) of hardening the resin layer 70. In addition, the resin layer 70 contracts when returning the temperature in the heating step to a room temperature. It is possible to apply the stress to the resonance portion 2c (active layer 30) with this contraction of the resin layer 70. The magnitude of the stress to be applied by the resin layer 70 to the resonance portion 2c depends on the shape of the resin layer 70. Accordingly, in the vertical cavity surface emitting laser 100, in a plan view, since the resin layer 70 has a shape line-symmetrical with respect to the virtual straight line L passing through the center O of the resonance portion 2c, it is possible to apply the stress symmetrical with respect to the virtual straight line L to the resonance portion 2c.

In the vertical cavity surface emitting laser 100, the lead-out wiring 86 which electrically connects the second electrode 82 and the pad 84 to each other is provided, and in a plan view, the lead-out wiring 86 is only provided on one side (same side as the pad 84), when seen from the virtual straight line L. Accordingly, in the same manner as the pad 84 described above, it is possible to decrease parasitic capacitance, compared to a case where the lead-out wiring 86 is provided on both sides when seen from the virtual straight line L, for example. In addition, it is possible to avoid the stub.

In the vertical cavity surface emitting laser 100, the laminated body 2 includes first distortion imparting portion 2a and the second distortion imparting portion 2b, the resonance portion 2c is provided between the first distortion imparting portion 2a and the second distortion imparting portion 2b, and in a plan view, the virtual straight line L is orthogonal to the direction in which the first distortion imparting portion 2a and the second distortion imparting portion 2b face each other. Accordingly, in the vertical cavity surface emitting laser 100, the stress can be applied to the resonance portion 2c (active layer 30) by both of the distortion imparting portions 2a and 2b and the resin layer 70, and it is possible to stabilize a polarization direction of laser light.

As described above, in the vertical cavity surface emitting laser 100, since it is possible to stabilize the polarization direction of the laser light, it is possible to stably emit circularly polarized light to the gas cell through a λ/4 plate, when the vertical cavity surface emitting laser 100 is used as a light source of the atomic oscillator, for example. As a result, it is possible to increase frequency stability of the atomic oscillator. For example, when the polarization direction of the laser light emitted from the vertical cavity surface emitting laser is not stable, the light obtained through the λ/4 plate may be elliptically polarized light or a rotation direction of the circularly polarized light may be fluctuated.

As described above, in the vertical cavity surface emitting laser 100, since it is possible to stabilize the polarization direction of the laser light, it is possible to stably emit the circularly polarized light to the gas cell through the λ/4 plate, and to increase the frequency stability of the atomic oscillator.

2. Manufacturing Method of Vertical Cavity Surface Emitting Laser

Next, a manufacturing method of the vertical cavity surface emitting laser according to the embodiment will be described with reference to the drawings. FIGS. 5 to 8 are cross-sectional views schematically showing manufacturing steps of the vertical cavity surface emitting laser 100 according to the embodiment, and correspond to FIG. 2.

Figure 5:
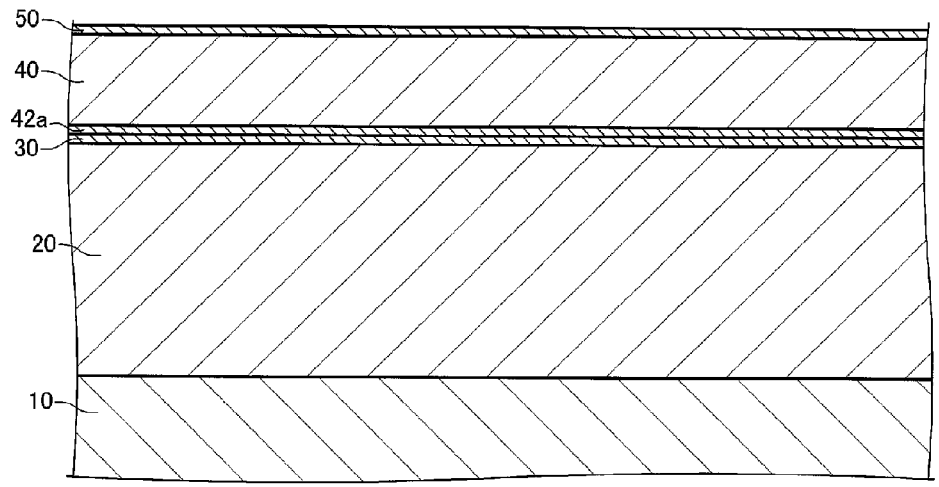
FIG. 5 is a cross-sectional view schematically showing a manufacturing step of a vertical cavity surface emitting laser according to the embodiment.

As shown in FIG. 5, the first mirror layer 20, the active layer 30, the layer to be oxidized 42a which is to be the oxidized current constriction layer 42, the second mirror layer 40, and the contact layer 50 are epitaxially grown in this order, on the substrate 10. As an epitaxial growth method, a metal organic chemical vapor deposition (MOCVD) method or a molecular beam epitaxy (MBE) method is used, for example.

Figure 6:
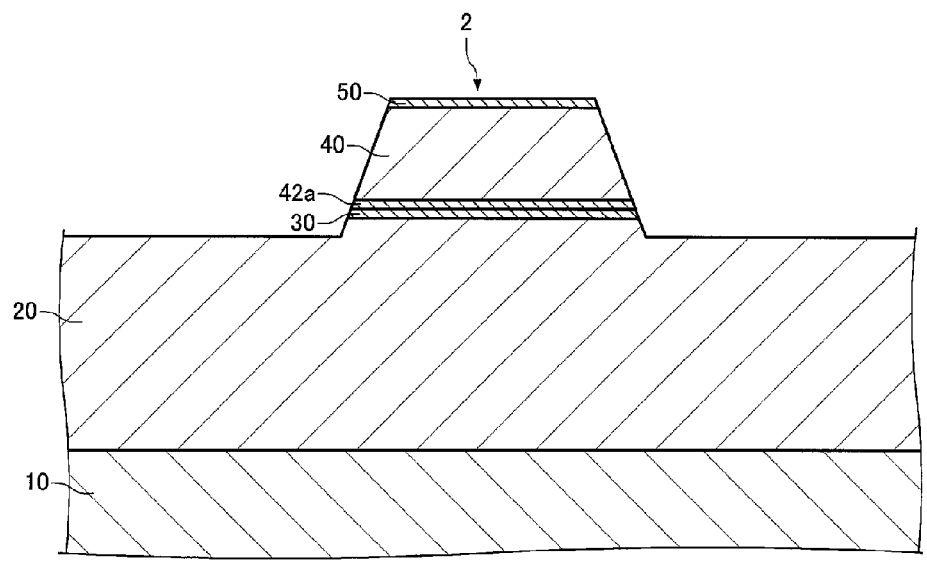
FIG. 6 is a cross-sectional view schematically showing a manufacturing step of a vertical cavity surface emitting laser according to the embodiment.

As shown in FIG. 6, the contact layer 50, the second mirror layer 40, the layer to be oxidized 42a, the active layer 30, and first mirror layer 20 are patterned to form the laminated body 2. The patterning is performed by photolithography or etching, for example.

Figure 7:
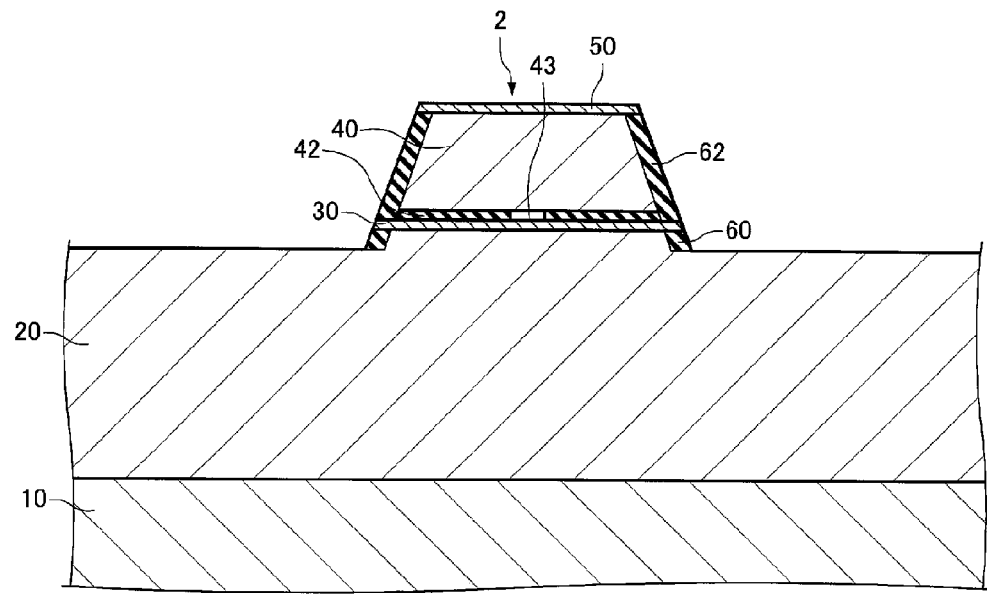
FIG. 7 is a cross-sectional view schematically showing a manufacturing step of a vertical cavity surface emitting laser according to the embodiment.

As shown in FIG. 7, the layer to be oxidized 42a is oxidized to form the current constriction layer 42. The layer to be oxidized 42a is, for example, an $Al_xGa_{1-x}As$ (x≥0.95) layer. The substrate 10 on which the laminated body 2 is formed is put in a steam atmosphere at approximately 400° C., to oxidize the $Al_xGa_{1-x}As$ (x≥0.95) layer from the lateral side, and accordingly the current constriction layer 42 is formed.

In the manufacturing method of the vertical cavity surface emitting laser 100, in the oxidization step, a layer configuring the first mirror layer 20 is oxidized from the lateral side to form the first area 60. A layer configuring the second mirror layer 40 is oxidized from the lateral side to form the second area 62. Specifically, due to the steam atmosphere at approximately 400° C., arsenic in the $Al_{0.9}Ga_{0.1}As$ layer configuring the mirror layers 20 and 40 is substituted with oxygen, and the areas 60 and 62 are formed. The areas 60 and 62, for example, contract when returning the temperature from the high temperature of approximately 400° C. to the room temperature, and the upper surface 63 of the second area 62 is inclined to the substrate 10 side (see FIG. 4). The first distortion imparting portion 2a and the second distortion imparting portion 2b can apply distortion (stress) caused by the contraction of the areas 60 and 62 to the active layer 30.

Figure 8:
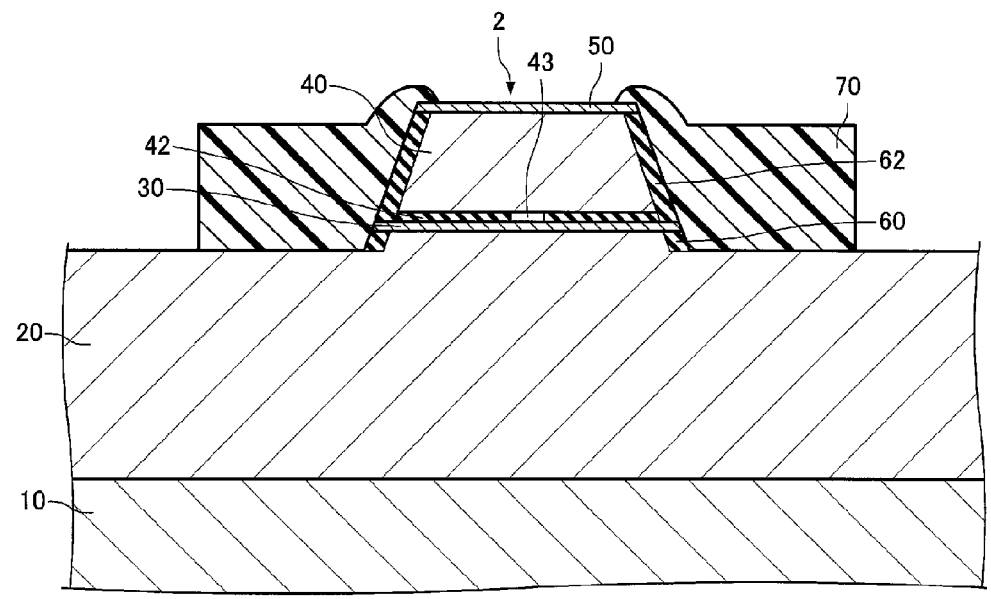
FIG. 8 is a cross-sectional view schematically showing a manufacturing step of a vertical cavity surface emitting laser according to the embodiment.

As shown in FIG. 8, the resin layer 70 is formed so as to surround the laminated body 2. The resin layer 70 is formed, for example, by forming a layer formed of a polyimide resin on the upper surface of the first mirror layer 20 and the entire surface of the laminated body 2 using a spin coating method and patterning the layer. The patterning is performed by photolithography or etching, for example. Next, the resin layer 70 is hardened by performing a heating process (curing). The resin layer 70 contracts due to the heating process. In addition, the resin layer 70 contracts when returning the temperature in the heating step to a room temperature.

As shown in FIG. 2, the second electrode 82 is formed on the contact layer 50 and the resin layer 70, and the first electrode 80 is formed on the first mirror layer 20. The electrodes 80 and 82 are, for example, formed by a combination of a vacuum vapor deposition method and a lift-off method. The order of forming the electrodes 80 and 82 is not particularly limited. In the step of forming the second electrode 82, the pad 84 and the lead-out wiring 86 (see FIG. 1) may be formed.

It is possible to manufacture the vertical cavity surface emitting laser 100 with the steps described above.

3. Atomic Oscillator

Figure 9:
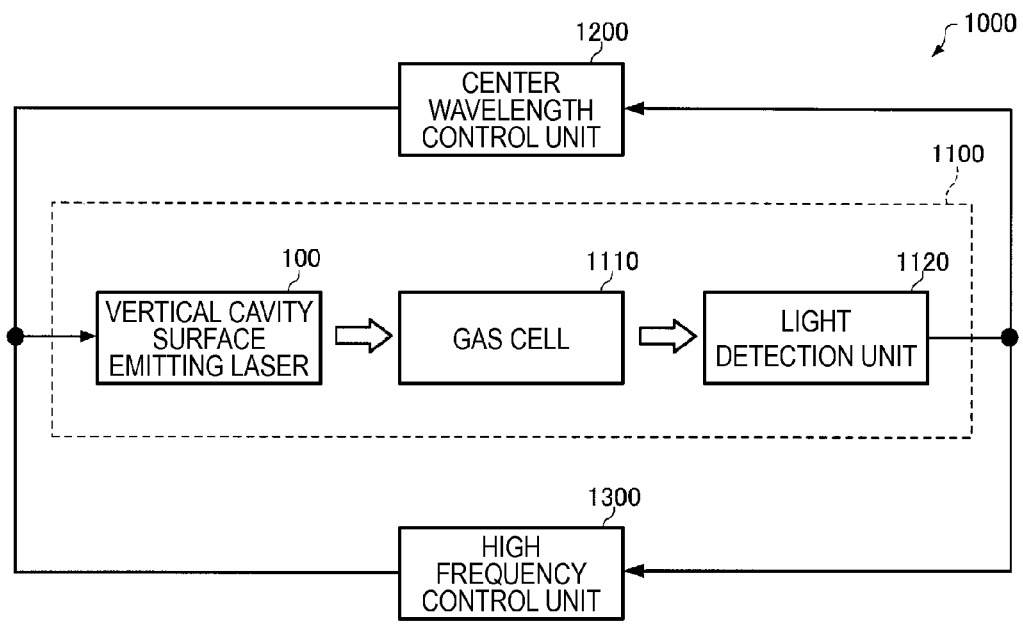
FIG. 9 is a functional block diagram of an atomic oscillator according to the embodiment.

Next, an atomic oscillator according to the embodiment will be described with reference to the drawings. FIG. 9 is a functional block diagram of an atomic oscillator 1000 according to the embodiment.

As shown in FIG. 9, the atomic oscillator 1000 is configured to include an optical module 1100, a center wavelength control unit 1200, and a high frequency control unit 1300.

The optical module 1100 includes the vertical cavity surface emitting laser according to the invention (in the example shown in the drawing, the vertical cavity surface emitting laser 100), a gas cell 1110, and a light detection unit 1120.

Figure 10:
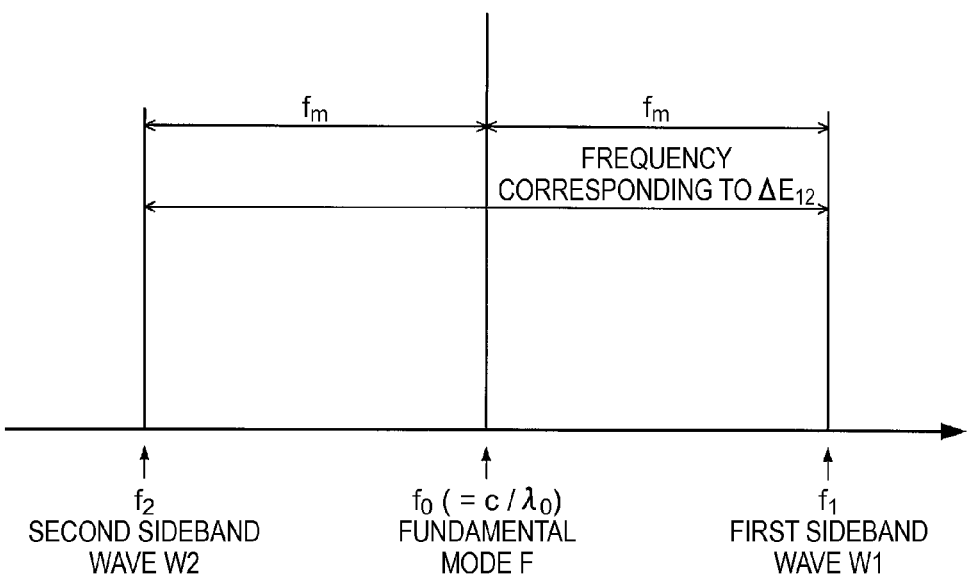
FIG. 10 is a view showing frequency spectra of resonant light.
Figure 11:
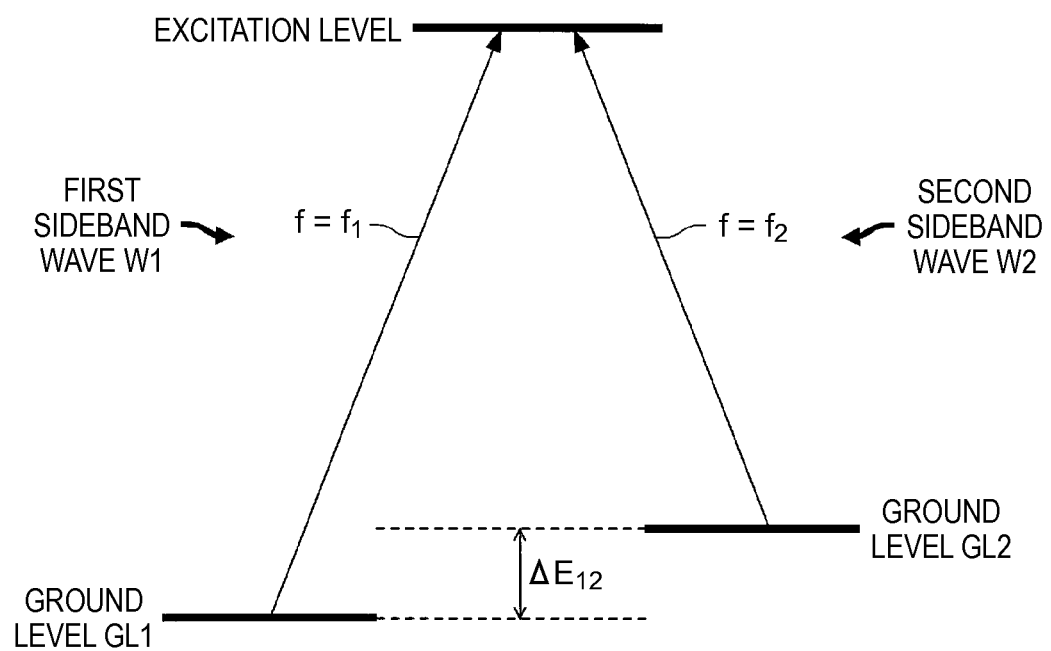
FIG. 11 is a view showing a relationship between Λ-shaped three level models of an alkaline metal atom, a first sideband wave, and a second sideband wave.

FIG. 10 is a view showing frequency spectra of light emitted by the vertical cavity surface emitting laser 100. FIG. 11 is a view showing a relationship between Λ-shaped three level models of an alkaline metal atom, a first sideband wave W1, and a second sideband wave W2. The light emitted from the vertical cavity surface emitting laser 100 includes a fundamental mode F including a center frequency $f_0$ (=$c/\lambda_0$: c represents velocity of light and $\lambda_0$ represents a center wavelength of laser light), the first sideband wave W1 including a frequency $f_1$ in an upstream sideband with respect to the center frequency $f_0$, and the second sideband wave W2 including a frequency $f_2$ in an downstream sideband with respect to the center frequency $f_0$, shown in FIG. 10. The frequency $f_1$ of the first sideband wave W1 satisfies $f_1=f_0+f_m$, and the frequency $f_2$ of the second sideband wave W2 satisfies $f_2=f_0-f_m$.

As shown in FIG. 11, a difference in frequencies between the frequency $f_1$ of the first sideband wave W1 and the frequency $f_2$ of the second sideband wave W2 coincides with a frequency corresponding to a difference in energy $\Delta E_{12}$ between a ground level GL1 and a ground level GL2 of the alkaline metal atom. Accordingly, the alkaline metal atom causes an EIT phenomenon to occur due to the first sideband wave W1 including the frequency $f_1$ and the second sideband wave W2 including the frequency $f_2$.

In the gas cell 1110, a gaseous alkaline metal atom (sodium atom, rubidium atom, cesium atom, and the like) is sealed in a container. When two light waves including the frequency (wavelength) corresponding to the difference in energy between two ground levels of the alkaline metal atom are emitted to the gas cell 1110, the alkaline metal atom causes the EIT phenomenon to occur. For example, if the alkaline metal atom is a cesium atom, the frequency corresponding to the difference in energy between the ground level GL1 and the ground level GL2 in a D1 line is 9.19263 . . . GHz.

Accordingly, when two light waves including the difference in frequency of 9.19263 . . . GHz are emitted, the EIT phenomenon occurs.

The light detection unit 1120 detects the intensity of the light penetrating the alkaline metal atom sealed in the gas cell 1110. The light detection unit 1120 outputs a detection signal according to the amount of the light penetrating the alkaline metal atom. As the light detection unit 1120, a photodiode is used, for example.

The center wavelength control unit 1200 generates driving current having a magnitude corresponding to the detection signal output by the light detection unit 1120, supplies the driving current to the vertical cavity surface emitting laser 100, and controls the center wavelength $\lambda_0$ of the light emitted by the vertical cavity surface emitting laser 100. The center wavelength $\lambda_0$ of the laser light emitted by the vertical cavity surface emitting laser 100 is minutely adjusted and stabilized, by a feedback loop passing through the vertical cavity surface emitting laser 100, the gas cell 1110, the light detection unit 1120, and the center wavelength control unit 1200.

The high frequency control unit 1300 controls so that the difference in wavelengths (frequencies) between the first sideband wave W1 and the second sideband wave W2 is equivalent to the frequency corresponding to the difference in energy between two ground levels of the alkaline metal atom sealed in the gas cell 1110, based on the detection result output by the light detection unit 1120. The high frequency control unit 1300 generates a modulation signal including a modulation frequency $f_m$ (see FIG. 10) according to the detection result output by the light detection unit 1120.

Feedback control is performed so that the difference in frequencies between the first sideband wave W1 and the second sideband wave W2 is extremely accurately equivalent to the frequency corresponding to the difference in energy between two ground levels of the alkaline metal atom, by a feedback loop passing through the vertical cavity surface emitting laser 100, the gas cell 1110, the light detection unit 1120, and the high frequency control unit 1300. As a result, the modulation frequency $f_m$ becomes an extremely stabilized frequency, and therefore, the modulation signal can be set as an output signal (clock output) of the atomic oscillator 1000.

Next, the operations of the atomic oscillator 1000 will be described with reference to FIGS. 9 to 11.

The laser light emitted from the vertical cavity surface emitting laser 100 is incident to the gas cell 1110. The light emitted from the vertical cavity surface emitting laser 100 includes two light waves (the first sideband wave W1 and the second sideband wave W2) including the frequency (wavelength) corresponding to the difference in energy between two ground levels of the alkaline metal atom, and the alkaline metal atom causes the EIT phenomenon to occur. The intensity of the light penetrating the gas cell 1110 is detected by the light detection unit 1120.

The center wavelength control unit 1200 and the high frequency control unit 1300 perform the feedback control so that the difference in frequencies between the first sideband wave W1 and the second sideband wave W2 extremely accurately coincides with the frequency corresponding to the difference in energy between two ground levels of the alkaline metal atom. In the atomic oscillator 1000, a rapid change in a light absorbing behavior when the difference in frequencies $f_1-f_2$ between the first sideband wave W1 and the second sideband wave W2 is deviated from the frequency corresponding to the difference in energy $\Delta E_{12}$ between the ground level GL1 and the ground level GL2, is detected and controlled using the EIT phenomenon, and therefore it is possible to obtain an oscillator with high accuracy.

The invention has configurations substantially same as the configurations described in the embodiments (for example, configurations with the same function, method, and effects, or configurations with the same object and effect). The invention includes a configuration in which non-essential parts of the configurations described in the embodiments are replaced. The invention includes a configuration having the same operation effect as the configurations described in the embodiments or a configuration which can achieve the same object. The invention includes a configuration obtained by adding a well-known technology to the configurations described in the embodiments.

The entire disclosure of Japanese Patent Application No. 2013-263466, filed Dec. 20, 2013 is expressly incorporated by reference herein.

What is claimed is:

1. A vertical cavity surface emitting laser comprising:
   a substrate;
   a first mirror layer which is provided over the substrate;
   an active layer which is provided over the first mirror layer;
   a second mirror layer which is provided over the active layer;
   a first electrode which is electrically connected to the first mirror layer;
   a second electrode which is electrically connected to the second mirror layer; and
   a pad which is electrically connected to the second electrode,
   wherein the first mirror layer, the active layer, and the second mirror layer configure a laminated body,
   the laminated body includes a resonance portion which resonates light generated by the active layer,
   an insulation layer is provided on a side surface of the laminated body, and the first mirror layer extends outward from the insulation layer in a plan view,
   in the plan view, the insulation layer has a shape line-symmetrical with respect to a virtual straight line passing through a center of the resonance portion,
   the pad is provided over the insulation layer, and
   in the plan view, the pad is only provided on one side of the virtual straight line.

2. The vertical cavity surface emitting laser according to claim 1, further comprising:
   a lead-out wiring which electrically connects the second electrode and the pad to each other.

3. The vertical cavity surface emitting laser according to claim 2,
   wherein, in the plan view, the lead-out wiring is only provided on the one side of the virtual straight line.

4. The vertical cavity surface emitting laser according to claim 1,
   wherein the laminated body includes a first distortion imparting portion and a second distortion imparting portion,
   the resonance portion is provided between the first distortion imparting portion and the second distortion imparting portion, and
   in the plan view, the virtual straight line is orthogonal to a direction in which the first distortion imparting portion and the second distortion imparting portion face each other.

5. An atomic oscillator comprising:
   the vertical cavity surface emitting laser according to claim 1.

6. An atomic oscillator comprising:
   the vertical cavity surface emitting laser according to claim 2.

7. An atomic oscillator comprising:
the vertical cavity surface emitting laser according to claim 3.

8. An atomic oscillator comprising:
the vertical cavity surface emitting laser according to claim 4.

\* \* \* \* \*